United States Patent
Liu et al.

(10) Patent No.: US 11,362,666 B2
(45) Date of Patent: Jun. 14, 2022

(54) LOW-JITTER FREQUENCY DIVISION CLOCK CLOCK CIRCUIT

(71) Applicant: NO.24 RESEARCH INSTITUTE OF CHINA ELECTRONICS TECHNOLOGY GROUP CORPORATION, Chongqing (CN)

(72) Inventors: Tao Liu, Chongqing (CN); Jian'an Wang, Chongqing (CN); Yuxin Wang, Chongqing (CN); Guangbing Chen, Chongqing (CN); Dongbing Fu, Chongqing (CN); Ruzhang Li, Chongqing (CN); Shengdong Hu, Chongqing (CN); Zhengping Zhang, Chongqing (CN); Jun Luo, Chongqing (CN); Daiguo Xu, Chongqing (CN); Minming Deng, Chongqing (CN); Yan Wang, Chongqing (CN)

(73) Assignee: NO. 24 RESEARCH INSTITUTE OF CHINA ELECTRONICS TECHNOLOGY GROUP CORPORATION, Chongqing (CN)

( * ) Notice: Subject to any disclaimer, the term of this patent is extended or adjusted under 35 U.S.C. 154(b) by 0 days.

(21) Appl. No.: 17/264,298

(22) PCT Filed: Dec. 13, 2018

(86) PCT No.: PCT/CN2018/120791
§ 371 (c)(1),
(2) Date: Jan. 29, 2021

(87) PCT Pub. No.: WO2020/024515
PCT Pub. Date: Feb. 6, 2020

(65) Prior Publication Data
US 2021/0297080 A1      Sep. 23, 2021

(30) Foreign Application Priority Data

Aug. 3, 2018   (CN) .......................... 201810877178.2

(51) Int. Cl.
*H03K 23/00*     (2006.01)
*H03K 23/44*     (2006.01)
(Continued)

(52) U.S. Cl.
CPC ....... *H03K 23/44* (2013.01); *H03K 3/356017* (2013.01); *H03K 5/15026* (2013.01);
(Continued)

(58) Field of Classification Search
None
See application file for complete search history.

(56) References Cited

U.S. PATENT DOCUMENTS 5,172,400 A * 12/1992 Maemura ............... H03K 21/10
                                                        377/114
6,583,655 B2    6/2003 Takahashi et al.
(Continued)

FOREIGN PATENT DOCUMENTS

CN          1540866 A      10/2004
CN          1996762 A       7/2007
(Continued)

*Primary Examiner* — Tuan T Lam

(57) ABSTRACT

The present disclosure provides a low-jitter frequency division clock circuit, including: a clock control signal generation circuit, to generate clock signals having different phases; a low-level narrow pulse width clock control signal generation circuit, to generate a low-level narrow pulse width clock control signal; a high-level narrow pulse width clock control signal generation circuit, to generate a high-level narrow pulse width clock control signal; and a frequency division clock generation circuit, to generate a frequency division clock signal according to low-level narrow pulse width clock control signal and high-level narrow pulse width
(Continued)

pulse width clock control signal. The delay from a clock input end to an output end of low-jitter frequency division clock circuit is up to three logic gates. Compared with traditional divide-by-2 frequency division clock circuits based on D-flip-flop, the low-jitter frequency division clock circuit of the present disclosure has fewer logic gates, a shorter delay, and lower jitter.

15 Claims, 3 Drawing Sheets

(51) Int. Cl.
    *H03K 3/356*      (2006.01)
    *H03K 5/15*      (2006.01)
    *H03K 23/42*      (2006.01)
    *H03K 23/50*      (2006.01)
    *H03K 23/52*      (2006.01)
    *H03K 23/66*      (2006.01)

(52) U.S. Cl.
    CPC ........... *H03K 23/42* (2013.01); *H03K 23/425* (2013.01); *H03K 23/50* (2013.01); *H03K 23/52* (2013.01); *H03K 23/662* (2013.01)

(56) References Cited

U.S. PATENT DOCUMENTS 7,734,001 B2 * 6/2010 Saeki .................. H03K 23/546
                                                         375/376
9,485,079 B2 * 11/2016 Mikkola ................ H03K 23/68

FOREIGN PATENT DOCUMENTS

| | | |
|---|---|---|
| CN | 101087132 A | 12/2007 |
| CN | 101087141 A | 12/2007 |
| CN | 103929173 A | 7/2014 |
| CN | 107547082 A | 1/2018 |

* cited by examiner

LOW-JITTER FREQUENCY DIVISION CLOCK CLOCK CIRCUIT

CROSS REFERENCES TO RELATED APPLICATIONS

This is a Sect. 371 National Stage application of a PCT International Application No. PCT/CN2018/120791, filed on Dec. 13, 2018, which claims priority of a Chinese Patent Applications No. 2018108771782, filed on Aug. 3, 2018, the content of which is hereby incorporated by reference in its entirety for all purposes.

TECHNICAL FIELD

The present disclosure relates to the field of electronics, in particular, to a low-jitter frequency division clock circuit.

BACKGROUND

With the development of 5G communication, the Internet of Things and big data technology, the bandwidth of system processing signal is getting wider, and the bandwidth of wireless signal reception is getting wider, too. The instantaneous bandwidth of the A/D converter is required to be increased, which in turn requires the sampling rate of the A/D converter to be higher. Affected by factors such as device characteristic speed, parasitic effect, finite rise time and finite fall time of a clock, the sampling rate of a single channel A/D converter is always limited.

At present, in order to further increase the sampling rate of the A/D converter, one of the mainstream technologies is to use time interleaving technology, which uses multiple channels to alternately and sequentially sample, quantize, and encode the analog input signals, and then synthesizes them in the digital domain, thus improving the sampling rate of the A/D converter. One of the technical bottlenecks in the design of time-interleaved A/D converters is the low jitter clock. Taking the two-channel time-interleaved A/D converter as an example, assuming the system clock frequency is fs, the A/D converter is composed of two channels, channel A and channel B, and the sampling clock frequency of channel A and channel B is 0.5×fs. The phase difference of the sampling clocks of channel A and channel B is π, therefore, a frequency division circuit is required to change the master clock frequency from fs to 0.5×fs. A divide-by-2 frequency division clock circuit commonly used in the design of digital integrated circuits is shown in FIG. 1 and the flip-flop in FIG. 1 is shown in FIG. 2. The advantages of this flip-flop lie in its simple structure and easy implementation, but the disadvantages are also obvious. The disadvantages are as follows: First, the master clock fs must pass through at least 6 or more logic gates to convert into divide-by-2 frequency division output, the noise of each logic gate on the transmission path contributes to the output divide-by-2 frequency division clock noise, and the jitter is larger. Second, the output of each logic gate on the transmission path is susceptible to the power supply noise, which contributes to the output divide-by-2 frequency division clock noise, and increases jitter, and the output clock of this frequency division circuit is more sensitive to the power supply noise. Third, the output drive of this flip-flop is very limited, as the load increases, more buffers must be inserted between the flip-flop output CKOUT and the load, which further leads to greater jitter in the clock signal on the load. As the output signal-to-noise ratio of the A/D converter increases with the analog input frequency and the resolution, the requirements of A/D converter to clock jitter are getting higher. The clock jitter generated by the traditional D flip-flop frequency division clock circuit is large, and can no longer meet the design requirements of high-speed and high-precision A/D converters.

SUMMARY

The present disclosure provides a low-jitter frequency division clock circuit.

The low-jitter frequency division clock circuit provided by the present disclosure includes:
a clock control signal generation circuit, to generate clock signals having different phases;
a low-level narrow pulse width clock control signal generation circuit, to generate a low-level narrow pulse width clock control signal;
a high-level narrow pulse width clock control signal generation circuit, to generate a high-level narrow pulse width clock control signal;
and a frequency division clock generation circuit, to generate a frequency division clock signal according to the low-level narrow pulse width clock control signal and the high-level narrow pulse width clock control signal;
an input end of the clock control signal generation circuit is connected to an input end of the clock input signal. An output end of the clock control signal generation circuit is respectively connected to an input end of the low-level narrow pulse width clock control signal generation circuit and an input end of the high-level narrow pulse width clock control signal generation circuit. The output end of the low-level narrow pulse width clock control signal generation circuit and the output end of the high-level narrow pulse width clock control signal generation circuit are connected to the input end of the frequency division clock generation circuit, respectively.

Further, the clock signals with different phases generated by the clock control signal generation circuit are a first clock signal, a second clock signal, a third clock signal, and a fourth clock signal, respectively. The input end of the clock input signal, the first clock signal and the third clock signal are respectively connected to the input end of the low-level narrow pulse width clock control signal generation circuit. The input end of the clock input signal, the second clock signal and the fourth clock signal are respectively connected to the input end of the high-level narrow pulse width clock control signal generation circuit.

Further, the clock control signal generation circuit includes: a first inverter, a first D flip-flop, a second D flip-flop, a second buffer, a third buffer, a fourth buffer, and a fifth buffer;

The clock signal input end of the first D flip-flop is connected to the input end of the clock input signal. The input end D of the first D flip-flop is connected to the QN output end of the first D flip-flop. The QN output end of the first D flip-flop is connected to the input end of the second buffer. The output end of the second buffer outputs the first clock signal.

The Q input end of the first D flip-flop is connected to the input end of the third buffer. The output end of the third buffer outputs the second clock signal.

The input end of the first inverter is connected to the input end of the clock input signal. The output end of the first inverter is connected to the clock signal input end of the second D flip-flop. The output end of the third buffer is connected to the D input end of the second D flip-flop. The Q output end of the second D flip-flop is connected to the input end of the fourth buffer. The output end of the fourth buffer outputs the third clock signal.

The QN output end of the second D flip-flop is connected to the input end of the fifth buffer, and the output end of the fifth buffer outputs the fourth clock signal.

Further, the low-level narrow pulse width clock control signal generation circuit includes a first two-input NOR gate and a first two-input NAND gate. The first input end of the first two-input NOR gate is connected to the first clock signal, the second input end of the first two-input NOR gate is connected to the third clock signal, the output end of the first two-input NOR gate is connected to the first input end of the first two-input NAND gate. The second input end of the first two-input NAND gate is connected to the input end of the clock input signal. The output end of the first two-input NAND gate outputs the low-level narrow pulse width clock control signal.

Further, the high-level narrow pulse width clock control signal generation circuit includes a second two-input NOR gate G7, a second two-input NAND gate G9 and a second inverter. The first input end of the second two-input NOR gate is connected to the second clock signal, the second input end of the second two-input NOR gate is connected to the fourth clock signal, the output end of the second two-input NOR gate is connected to the first input end of the second two-input NAND gate. The second input end of the second two-input NAND gate is connected to the input end of the clock input signal. The output end of the second two-input NAND gate is connected to the output end of the second inverter. The output end of the second inverter outputs the high-level narrow pulse width clock control signal.

Further, the frequency division clock generation circuit includes an NMOS transistor NM1, a PMOS transistor PM1, and a positive feedback loop for reducing the rising edge time and falling edge time of the clock at the output end.

The gate of the NMOS transistor is connected to the high-level narrow pulse width clock control signal, the source and substrate of the NMOS transistor are grounded, and the drain of the NMOS transistor is connected to the output end of the frequency division clock signal. The source and substrate of the PMOS transistor are connected to the power supply, and the drain of the PMOS transistor is connected to the output end of the frequency division clock signal.

Further, the positive feedback loop includes a third inverter G11, a fourth inverter G12, a fifth inverter G13, and a sixth inverter G14.

The third inverter, the fourth inverter, the fifth inverter, and the sixth inverter are connected sequentially. The input end of the third inverter is connected to the output end of the frequency division clock signal. The output end of the fifth inverter is connected to the output end of the frequency division clock signal.

Further, the frequency of the first clock signal, the second clock signal, the third clock signal and the fourth clock signal is ½ of the frequency of the clock input signal.

Further, the transitions of the rising edge and falling edge of the signal output by the output end of the frequency division clock signal occurs at the rising edge of the clock input signal.

Beneficial effects of the present disclosure: the delay from a clock input end to an output end of the low-jitter frequency division clock circuit is up to three logic gates. Compared with a delay of six logic gates or more of a traditional divide-by-2 frequency division clock circuit based on D-flip-flop, the low-jitter frequency division clock circuit of the present disclosure has fewer logic gates, a shorter delay, and lower jitter. The present disclosure has good cycle stability and low jitter characteristic, reduces the rising edge time and the falling edge time, benefits the low jitter characteristic, guarantees a fixed output phase difference of a flip-flop, and has enhanced driving performance.

DETAILED DESCRIPTION OF THE PREFERRED EMBODIMENTS

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure. It needs to be stated that the following embodiments and the features in the embodiments can be combined with one another under the situation of no conflict.

It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be freely changed, and the component layout configuration thereof may be more complex.

Figure 1:
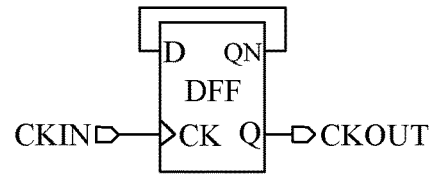
FIG. 1 is a circuit diagram of a traditional divide-by-2 frequency division clock circuit based on D-flip-flop according to an Embodiment of the present disclosure.
Figure 2:
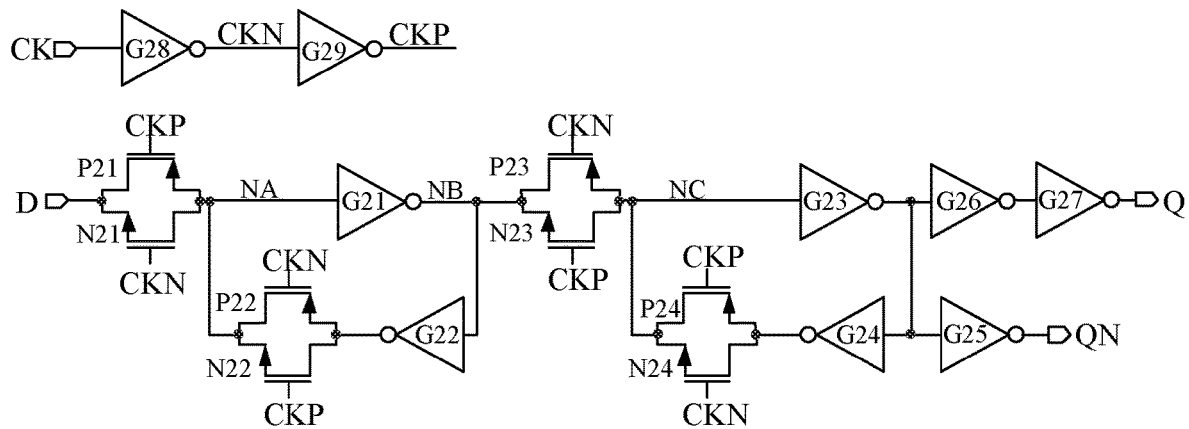
FIG. 2 is a circuit diagram of a D-flip-flop according to an Embodiment of the present disclosure.
Figure 4:
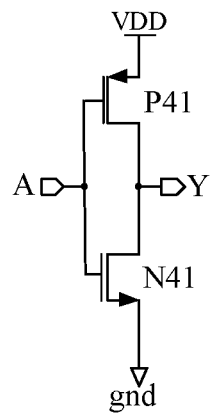
FIG. 4 is a circuit diagram of an inverter according to a circuit in an Embodiment of the present disclosure.
Figure 5:
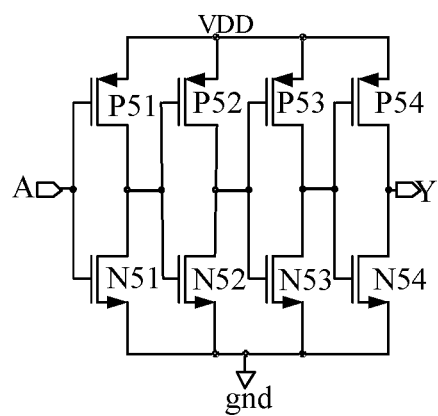
FIG. 5 is a circuit diagram of a buffer according to a circuit in an Embodiment of the present disclosure.
Figure 6:
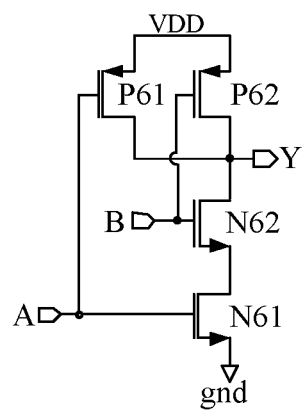
FIG. 6 is a circuit diagram of a two-input NAND gate according to a circuit in an Embodiment of the present disclosure.
Figure 7:
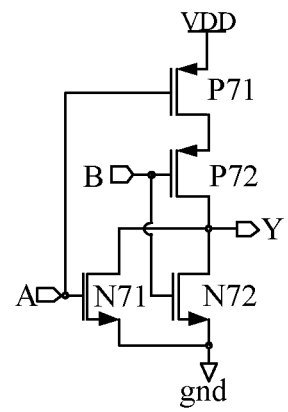
FIG. 7 is a circuit diagram of a two-input NOR gate according to a circuit in an Embodiment of the present disclosure.

FIG. 1 is a circuit diagram of a traditional divide-by-2 frequency division clock circuit based on D-flip-flop, and the structure of the D flip-flop is shown in FIG. 2. When the clock CK transitions from low level to high level, after buffering by inverter G28 and inverter G29, the clock CKP transitions from low level to high level. When the clock CKP transitions from low level to high level, the states of PMOS transistor P21 and NMOS transistor N21 change from the ON state to the OFF state; the states of PMOS transistor P22 and NMOS transistor N22 change from OFF state to ON state; the states of PMOS transistor P23 and NMOS transistor N23 change from OFF state to ON state; the states of PMOS transistor P24 and NMOS transistor N24 change from ON state to the OFF state; and the logic signal stored in the node NB is transmitted to the output Q (corresponding to CKOUT in FIG. 1) only after passing through the PMOS transistor P23, the NMOS transistor N23, the inverter G23, the inverter G26 and the inverter G27. According to the above analysis, in order to get a divide-by-2 frequency division clock signal CKOUT, the rising edge information of clock CK must pass through at least 6 logic gates including inverter G28, a transmission gate composed of inverter G29 and PMOS transistor P23, NMOS transistor N23, inverter G23, inverter G26 and inverter G27. The structure of the inverter is shown in FIG. 4. Similarly, when the clock CK is at high level and the clock CK transitions from high level to low level, the states of each PMOS transistor and NMOS transistor are opposite to the working states when the clock CK is at low level and the clock CK transitions from low level to high level, which will not be described herein. The disadvantage of this divide-by-2 frequency division clock circuit based on D-flip-flop lies in: First, the divide-by-2 frequency division clock signal can be obtained only after the signal passing through at least 6 or more logic gates, the noise of the logic gates on the transmission path contributes to the noise of the output divide-by-2 frequency division clock signal, which results in greater jitter. Second, the output of each logic gate on the transmission path is susceptible to the power supply noise, which contributes to the noise of the output divide-by-2 frequency division clock signal, and increases jitter, and the frequency division clock is sensitive to the power supply noise. Third, the flip-flop is small in size and has a very limited output drive, as the load increases, more buffers must be inserted between the flip-flop output CKOUT and the load, which further leads to greater jitter in the clock on the load.

Figure 3:
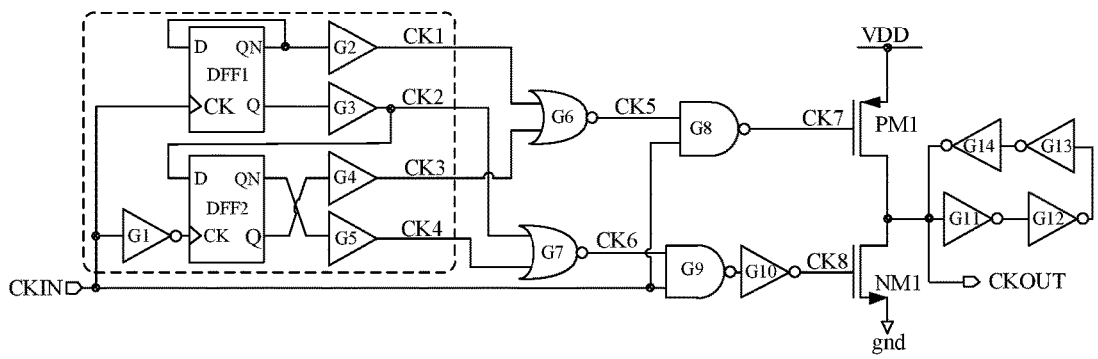
FIG. 3 is a circuit diagram of a low-jitter divide-by-2 frequency division clock circuit according to an Embodiment of the present disclosure.

As shown in FIG. 3, the low-jitter frequency division clock circuit of this Embodiment includes:

a clock control signal generation circuit, to generate clock signals having different phases;

a low-level narrow pulse width clock control signal generation circuit, to generate a low-level narrow pulse width clock control signal;

a high-level narrow pulse width clock control signal generation circuit, to generate a high-level narrow pulse width clock control signal; and a frequency division clock generation circuit, to generate a frequency division clock signal according to the low-level narrow pulse width clock control signal and the high-level narrow pulse width clock control signal.

An input end of the clock control signal generation circuit is connected to an input end of the clock input signal. An output end of the clock control signal generation circuit is respectively connected to an input end of the low-level narrow pulse width clock control signal generation circuit and an input end of the high-level narrow pulse width clock control signal generation circuit. The output end of the low-level narrow pulse width clock control signal generation circuit and the output end of the high-level narrow pulse width clock control signal generation circuit are connected to the input end of the frequency division clock generation circuit, respectively.

In this Embodiment, the CMOS clock signals with different phases generated by the clock control signal generation circuit include a first clock signal CK1, a second clock signal CK2, a third clock signal CK3, and a fourth clock signal CK4, respectively. The input end CKIN of the clock input signal, the first clock signal CK1 and the third clock signal CK3 are respectively connected to the input end of the low-level narrow pulse width clock control signal generation circuit. The input end CKIN of the clock input signal, the second clock signal CK2 and the fourth clock signal CK4 are respectively connected to the input end of the high-level narrow pulse width clock control signal generation circuit.

In this Embodiment, the clock control signal generation circuit includes a first inverter G1, a first D flip-flop DFF1, a second D flip-flop DFF2, a second buffer G2, a third buffer G3, a fourth buffer G4 and a fifth buffer G5. In this embodiment, the first D flip-flop DFF1 and the second D flip-flop DFF2 are rising-edge D flip-flops. The clock signal input end CK of the first D flip-flop DFF1 is connected to the input end CKIN. The input end D of the first D flip-flop DFF1 is connected to the output end QN of the first D flip-flop DFF1. The output end QN of the first D flip-flop DFF1 is connected to the input end of the second buffer G2. The output end of the second buffer G2 is connected to the first clock signal CK1. The output end Q of the first D flip-flop DFF1 is connected to the input end of the third buffer G3. The output end of the third buffer G3 is connected to the second clock signal CK2. The input end of the first inverter G1 is connected to the input end CKIN. The output end of the first inverter G1 is connected to the clock signal input end CK of the second D flip-flop DFF2. The input end D of the second D flip-flop DFF2 is connected to the second clock signal CK2. The output end QN of the second D flip-flop DFF2 is connected to the input end of the fifth buffer G5. The output end of the fifth buffer G5 is connected to the fourth clock signal CK4. The output end Q of the second D flip-flop DFF2 is connected to the input end of the fourth buffer G4. The output end of the fourth buffer G4 is connected to the third clock signal CK3.

In this Embodiment, the low-level narrow pulse width clock control signal generation circuit includes a first two-input NOR gate G6 and a first two-input NAND gate G8. An input end of the first two-input NOR gate G6 is connected to the first clock signal CK1 output by a four-phase clock control signal generation circuit, the other input end of the first two-input NOR gate G6 is connected to the third clock signal CK3 output by the four-phase clock control signal generation circuit. The fifth clock signal CK5 output by the output end of the first two-input NOR gate G6 is connected to an input end of the first two-input NAND gate G8, and the other input end of the first two-input NAND gate G8 is connected to the input clock signal end CKIN. The output end of the first two-input NAND gate G8 outputs the seventh clock signal CK7, i.e. the low-level narrow pulse width clock control signal.

In this Embodiment, the high-level narrow pulse width clock control signal generation circuit includes a second two-input NOR gate G7, a second two-input NAND gate G9 and a second inverter G10. An input end of the second two-input NOR gate G7 is connected to the second clock signal CK2 output by the four-phase clock control signal generation circuit, the other input end of the second two-input NOR gate G7 is connected to the fourth clock signal CK4 output by the four-phase clock control signal generation circuit. The sixth clock signal CK6 output by the second two-input NOR gate G7 is connected to an input end of the second two-input NAND gate G9, and the other input end of the second two-input NAND gate G9 is connected to the input clock signal end CKIN. The output end of the second two-input NAND gate G9 is connected to the input end of the second inverter G10. The output end of the second inverter G10 outputs the eighth clock signal CK8, i.e. the high-level narrow pulse width clock control signal.

In this Embodiment, the frequency division clock generation circuit includes an NMOS transistor NM1, a PMOS transistor PM1, and a positive feedback loop for reducing the rising edge time and falling edge time of the clock at the output end. The positive feedback loop includes a third inverter G11, a fourth inverter G12, a fifth inverter G13, and a sixth inverter G14.

The gate of the NMOS transistor NM1 is connected to CK8. The source and the substrate of the NMOS transistor NM1 are connected to the ground gnd. The drain of the NMOS transistor NM1 is connected to the output end CKOUT. The gate of the PMOS transistor PM1 is connected to CK7. The source and the substrate of the PMOS transistor PM1 are connected to the power supply VDD. The drain of the PMOS transistor PM1 is connected to the output end CKOUT. The output end of the third inverter G11 is connected to the input end of the fourth inverter G12. The output end of the fourth inverter G12 is connected to the input end of the fifth inverter G13. The output end of the fifth inverter G13 is connected to the input end of the sixth inverter G14. The output end of the sixth inverter G14 is connected to the output end CKOUT. The input end of the third inverter G11 is connected to the output end CKOUT.

Figure 8:
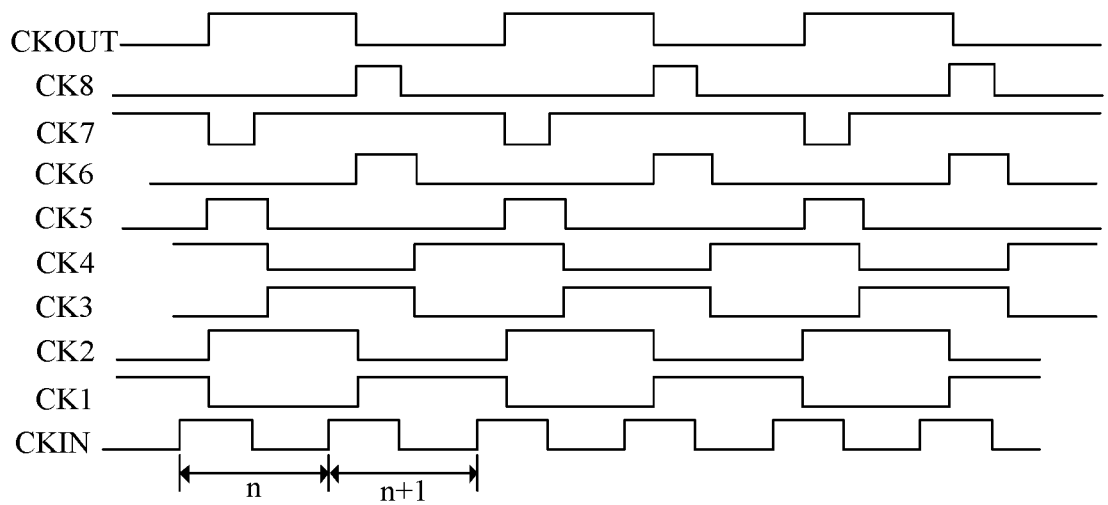
FIG. 8 is a schematic diagram of work sequence of a low-jitter divide-by-2 frequency division clock circuit in an Embodiment of the present disclosure.

As shown in FIG. 8, the working principle of the low-jitter frequency division clock circuit of this Embodiment is as follows:

When the clock CKIN is at low level, assuming that the initial state of the output Q of the first D flip-flop DFF1 is at low level, the second buffer G2 outputs a first clock signal CK1 at high level, the third buffer G3 outputs a second clock signal CK2 at low level, the fourth buffer G4 outputs a third clock signal CK3 at low level and the fifth buffer G5 outputs a fourth clock signal CK4 at high level. When the n-th rising edge arrives, the clock CKIN transitions from low level to high level. After the delay of the first D flip-flop DFF1 (delay time: t1) and the delay of the second buffer G2 (delay time: t2), the first clock signal CK1 output by the second buffer G2 transitions from high level to low level, and the second clock signal CK2 output by the third buffer G3 transitions from low level to high level. When the n-th falling edge arrives, the clock CKIN transitions from high level to low level. After the delay of the second D flip-flop DFF2 (delay time: t3) and the delay of the fourth buffer G4 (delay time: t4), the third clock signal CK3 output by the fourth buffer G4 transitions from low level to high level, and the fourth clock signal CK4 output by the fifth buffer G5 transitions from high level to low level. The first clock signal CK1 and the third clock signal CK3 are input to the first two-input NOR gate G6. During the n-th high level of the clock, the second NOR gate G7 performs NOR logic processing on the input second clock signal CK2 and fourth clock signal CK4, and outputs the sixth clock signal CK6 at low level. The AND gate formed by the second two-input NAND gate G9 and the second inverter G10 performs AND logic processing on the sixth clock signal CK6 and the input clock CKIN, and outputs the eighth clock signal CK8 at low level, and the NMOS transistor NM1 is turned off. At the same time, the first two-input NOR gate G6 performs a NOR logic processing on the input first clock signal CK1 and third clock signal CK3, and outputs a high-level pulse width signal. Immediately after that, the input clock CKIN and the fifth clock signal CK5 are input to the first two-input NAND gate G8. The first two-input NAND gate G8 performs NAND logic processing on the input CKIN and the fifth clock signal CK5, and outputs a low-level pulse width signal CK7. Under the action of the low-level pulse width signal CK7, the PMOS transistor PM1 is turned on. Since the NMOS transistor NM1 is turned off at this time, the output clock signal CKOUT is at high level, and the inverters G11, G12, G13 and G14 form a positive feedback loop, which increases the slope of clock signal CKOUT transitioning from low level to high level and reduces the rising time.

When the (n+1)-th rising edge arrives, the clock CKIN transitions from low level to high level. After the delay of the first D flip-flop DFF1 (delay time: t1) and the delay of the second buffer G2 (delay time: t2), the first clock signal CK1 output by the second buffer G2 transitions from low level to high level, and the second clock signal CK2 output by the third buffer G3 transitions from high level to low level. When the (n+1)-th falling edge arrives, the clock CKIN transitions from high level to low level. After the delay of the second D flip-flop DFF2 (delay time: t3) and the delay of the fourth buffer G4 (delay time: t4), the third clock signal CK3 output by the fourth buffer G4 transitions from high level to low level, and the fourth clock signal CK4 output by the fifth buffer G5 transitions from low level to high level. During the n-th high level of the clock, the first NOR gate G6 performs NOR logic processing on the input first clock signal CK1 and third clock signal CK3, and outputs a low-level signal. Immediately after that, the input clock CKIN and the fifth clock signal CK5 are input to the first two-input NAND gate G8. The first two-input NAND gate G8 performs NAND logic processing on the input CKIN and the fifth clock signal CK5, and outputs a high-level signal, and the PMOS transistor PM1 is turned off. At the same time, the second two-input NOR gate G7 performs NOR logic processing on the input second clock signal CK2 and fourth clock signal CK4, and outputs the high-level pulse width signal CK6. The AND gate formed by the second two-input NAND gate G9 and the inverter G10 performs AND logic processing on the sixth clock signal CK6 and the input clock CKIN, and outputs the high-level pulse width signal CK8, and the NMOS transistor NM1 is turned on. The PMOS transistor PM1 is turned off at this time, the output clock signal CKOUT is at low level, and the inverters G11, G12, G13 and G14 form a positive feedback loop, which increases the slope of clock signal CKOUT transitioning from high level to low level and reduces the falling time.

According to the above analysis, when the rising edge of the n-th clock of the input clock CKIN arrives, the output CKOUT becomes at high level. When the rising edge of the (n+1)-th clock of the input clock CKIN arrives, the output CKOUT becomes at low level. Over and over again, the clock frequency of the CKOUT output by the circuit is half of the frequency of the input clock CKIN.

The above-mentioned embodiments are merely illustrative of the principle and effects of the present disclosure instead of limiting the present disclosure. Modifications or variations of the above-described embodiments may be made by those skilled in the art without departing from the spirit and scope of the disclosure. Therefore, all equivalent modifications or changes made by those who have common knowledge in the art without departing from the spirit and technical concept disclosed by the present disclosure shall be still covered by the claims of the present disclosure.

The invention claimed is:

1. A low-jitter frequency division clock circuit, comprising:
    a clock control signal generation circuit, to generate clock signals having different phases;

a low-level narrow pulse width clock control signal generation circuit, to generate a low-level narrow pulse width clock control signal;

a high-level narrow pulse width clock control signal generation circuit, to generate a high-level narrow pulse width clock control signal;

and a frequency division clock generation circuit, to generate a frequency division clock signal according to the low-level narrow pulse width clock control signal and the high-level narrow pulse width clock control signal;

wherein an input end of the clock control signal generation circuit is connected with an input end of a clock input signal; an output end of the clock control signal generation circuit is respectively connected with an input end of the low-level narrow pulse width clock control signal generation circuit and an input end of the high-level narrow pulse width clock control signal generation circuit; an output end of the low-level narrow pulse width clock control signal generation circuit and an output end of the high-level narrow pulse width clock control signal generation circuit are connected with an input end of the frequency division clock generation circuit, respectively;

wherein the clock signals having different phases generated by the clock control signal generation circuit includes a first clock signal, a second clock signal, a third clock signal, and a fourth clock signal, respectively; the input end of the clock input signal, the first clock signal and the third clock signal are respectively connected with the input end of the low-level narrow pulse width clock control signal generation circuit; the input end of the clock input signal, the second clock signal and the fourth clock signal are respectively connected with the input end of the high-level narrow pulse width clock control signal generation circuit.

2. The low-jitter frequency division clock circuit according to claim 1, wherein the clock control signal generation circuit comprises: a first inverter, a first D flip-flop, a second D flip-flop, a second buffer, a third buffer, a fourth buffer, and a fifth buffer;

a clock signal input end of the first D flip-flop is connected with the input end of the clock input signal; an input end D of the first D flip-flop is connected with a QN output end of the first D flip-flop; the QN output end of the first D flip-flop is connected with an input end of the second buffer; an output end of the second buffer outputs the first clock signal;

a Q input end of the first D flip-flop is connected with an input end of the third buffer; an output end of the third buffer outputs the second clock signal;

an input end of the first inverter is connected with the input end of the clock input signal; an output end of the first inverter is connected with the clock signal input end of the second D flip-flop; the output end of the third buffer is connected with a D input end of the second D flip-flop; a Q output end of the second D flip-flop is connected with an input end of the fourth buffer; an output end of the fourth buffer outputs the third clock signal;

a QN output end of the second D flip-flop is connected with an input end of the fifth buffer, and an output end of the fifth buffer outputs the fourth clock signal.

3. The low-jitter frequency division clock circuit according to claim 2, wherein the low-level narrow pulse width clock control signal generation circuit comprises a first two-input NOR gate and a first two-input NAND gate; a first input end of the first two-input NOR gate is connected with the first clock signal, a second input end of the first two-input NOR gate is connected with the third clock signal, an output end of the first two-input NOR gate is connected with a first input end of the first two-input NAND gate, a second input end of the first two-input NAND gate is connected with the input end of the clock input signal, and an output end of the first two-input NAND gate outputs the low-level narrow pulse width clock control signal.

4. The low-jitter frequency division clock circuit according to claim 3, wherein the high-level narrow pulse width clock control signal generation circuit comprises a second two-input NOR gate, a second two-input NAND gate and a second inverter; a first input end of the second two-input NOR gate is connected with the second clock signal, a second input end of the second two-input NOR gate is connected with the fourth clock signal, an output end of the second two-input NOR gate is connected with a first input end of the second two-input NAND gate, a second input end of the second two-input NAND gate is connected with the input end of the clock input signal, an output end of the second two-input NAND gate is connected with an input end of the second inverter, and an output end of the second inverter outputs the high-level narrow pulse width clock control signal.

5. The low-jitter frequency division clock circuit according to claim 4, wherein the frequency division clock generation circuit comprises an NMOS transistor, a PMOS transistor, and a positive feedback loop to reduce a rising edge time and a falling edge time of the clock at the output end;

a gate of the NMOS transistor is connected with the high-level narrow pulse width clock control signal, a source and a substrate of the NMOS transistor are grounded, and a drain of the NMOS transistor is connected with an output end of the frequency division clock signal; a source and a substrate of the PMOS transistor are connected with a power supply, and a drain of the PMOS transistor is connected with the output end of the frequency division clock signal.

6. The low-jitter frequency division clock circuit according to claim 5, wherein the positive feedback loop comprises a third inverter, a fourth inverter, a fifth inverter and a sixth inverter;

the third inverter, the fourth inverter, the fifth inverter and the sixth inverter are connected sequentially, an input end of the third inverter is connected with the output end of the frequency division clock signal, and an output end of the fifth inverter is connected with the output end of the frequency division clock signal.

7. The low-jitter frequency division clock circuit according to claim 5, wherein a frequency of the first clock signal, the second clock signal, the third clock signal and the fourth clock signal is ½ of a frequency of the clock input signal.

8. The low-jitter frequency division clock circuit according to claim 1, wherein transitions of a rising edge and a falling edge of a signal output by an output end of the frequency division clock signal occurs at the rising edge of the clock input signal.

9. The low-jitter frequency division clock circuit according to claim 1, wherein transitions of a rising edge and a falling edge of a signal output by an output end of the frequency division clock signal occurs at the rising edge of the clock input signal.

10. The low-jitter frequency division clock circuit according to claim 2, wherein transitions of a rising edge and a falling edge of a signal output by an output end of the frequency division clock signal occurs at the rising edge of the clock input signal.

11. The low-jitter frequency division clock circuit according to claim 3, wherein transitions of a rising edge and a falling edge of a signal output by an output end of the frequency division clock signal occurs at the rising edge of the clock input signal.

12. The low-jitter frequency division clock circuit according to claim 4, wherein transitions of a rising edge and a falling edge of a signal output by an output end of the frequency division clock signal occurs at the rising edge of the clock input signal.

13. The low-jitter frequency division clock circuit according to claim 5, wherein transitions of a rising edge and a falling edge of a signal output by an output end of the frequency division clock signal occurs at the rising edge of the clock input signal.

14. The low-jitter frequency division clock circuit according to claim 6, wherein transitions of a rising edge and a falling edge of a signal output by an output end of the frequency division clock signal occurs at the rising edge of the clock input signal.

15. The low-jitter frequency division clock circuit according to claim 7, wherein transitions of a rising edge and a falling edge of a signal output by an output end of the frequency division clock signal occurs at the rising edge of the clock input signal.

* * * * *